(12) United States Patent
Lu

(10) Patent No.: US 12,598,730 B2
(45) Date of Patent: Apr. 7, 2026

(54) MEMORY DEVICE AND METHOD FOR FABRICATING SAME

(71) Applicant: CHANGXIN MEMORY TECHNOLOGIES, INC., Hefei (CN)

(72) Inventor: Jingwen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 785 days.

(21) Appl. No.: 17/976,849

(22) Filed: Oct. 30, 2022

(65) Prior Publication Data

US 2023/0049648 A1 Feb. 16, 2023

(30) Foreign Application Priority Data

Nov. 15, 2021 (CN) .......................... 202111384157.5

(51) Int. Cl.
*H10B 12/00* (2023.01)
*G11C 5/06* (2006.01)

(52) U.S. Cl.
CPC ............. *H10B 12/05* (2023.02); *G11C 5/063* (2013.01); *H10B 12/30* (2023.02); *H10B 12/488* (2023.02)

(58) Field of Classification Search
CPC ...... G11C 5/063; H10B 12/05; H10B 12/053; H10B 12/30; H10B 12/34; H10B 12/488
See application file for complete search history.

(56) References Cited

U.S. PATENT DOCUMENTS

| | | | | | |
|---|---|---|---|---|---|
| 6,458,290 | B1 * | 10/2002 | Marshall | .................. | C09G 1/02 257/E21.244 |
| 2008/0311715 | A1 * | 12/2008 | Hu | ........................ | H10B 12/053 438/278 |
| 2010/0213541 | A1 * | 8/2010 | Jeon | .................. | H01L 21/28202 257/334 |
| 2015/0175846 | A1 * | 6/2015 | Yoshida | ................ | B24B 37/044 438/692 |

FOREIGN PATENT DOCUMENTS

CN 105097641 A 11/2015

* cited by examiner

*Primary Examiner* — Britt Hanley
*Assistant Examiner* — Kevin Quinto
(74) *Attorney, Agent, or Firm* — Kilpatrick Townsend & Stockton LLP

(57) ABSTRACT

Embodiments provide a memory device and a method for fabricating the same, relating to the field of semiconductor technology. The method includes: forming buried gate structures in a first direction in a substrate; patterning the substrate, cutting off the buried gate structures, and forming active structures arranged at parallel intervals and isolation grooves between the active structures in a second direction, where the active structures are island-shaped columnar bodies, and the active structures include the buried gate structures; forming isolation structures in the isolation grooves, where surfaces of the isolation structures are flush with surfaces of the active structures; and forming conductive word lines in the first direction on the surfaces of isolation structures and the surfaces of the active structures, where the conductive word lines cover upper surfaces of the buried gate structures in the active structures.

18 Claims, 10 Drawing Sheets

401

402

403

701

701

503

501

201

MEMORY DEVICE AND METHOD FOR FABRICATING SAME

CROSS REFERENCE TO RELATED APPLICATION

This application claims priority to Chinese Patent Application No. 202111384157.5, titled "MEMORY DEVICE AND METHOD FOR FABRICATING SAME" and filed to the State Patent Intellectual Property Office on Nov. 15, 2021, the entire contents of which are incorporated herein by reference.

TECHNICAL FIELD

The present disclosure relates to the field of semiconductor technology, and more particularly, to a memory device and a method for fabricating the same.

BACKGROUND

In existing processes for fabricating a memory device, an embedded gate generally penetrates through an active structure and an isolation structure. When a row of embedded gates in a memory matrix are activated or refreshed repeatedly, it is easy to produce noise or interference to an adjacent row, resulting in row hammer effects, which leads to data errors in one or more cells in the adjacent row, and thus adversely affects performance of the memory.

SUMMARY

On this account, an objective of the present disclosure is to provide a memory device and a method for fabricating the same.

To achieve the above objective, embodiments of the present disclosure adopt technical solutions as below.

A method for fabricating a memory device includes: forming a plurality of buried gate structures in a first direction in a substrate; patterning the substrate, cutting off the plurality of buried gate structures, and forming a plurality of active structures arranged at parallel intervals and isolation grooves between the plurality of active structures in a second direction, where the plurality of active structures are island-shaped columnar bodies, and the plurality of active structures comprise the plurality of remained buried gate structures; forming isolation structures in the isolation grooves, where surfaces of the isolation structures are flush with surfaces of the plurality of active structures; and forming a plurality of conductive word lines in the first direction on the top surfaces of isolation structures and the top surfaces of the plurality of active structures, where the plurality of conductive word lines cover upper surfaces of the plurality of buried gate structures in the plurality of active structures.

A memory device comprises: a substrate, a plurality of buried gate structures formed on the substrate, isolation structures, a plurality of active structures arranged at parallel intervals in a second direction, and a plurality of conductive word lines in a first direction.

To make the above objectives, features and advantages of the present disclosure more apparent and pellucid, a detailed description is made below by illustrating some embodiments with reference to the accompanying drawings.

BRIEF DESCRIPTION OF THE DRAWINGS

To describe the technical solutions of the embodiments of the present disclosure or that of the prior art more clearly, the accompanying drawings required for describing the embodiments or the prior art will be briefly introduced below. Apparently, the accompanying drawings in the following description are merely some embodiments of the present disclosure. To those of ordinary skills in the art, other accompanying drawings may also be derived from these accompanying drawings without creative efforts.

REFERENCE NUMERALS

Figure 1:
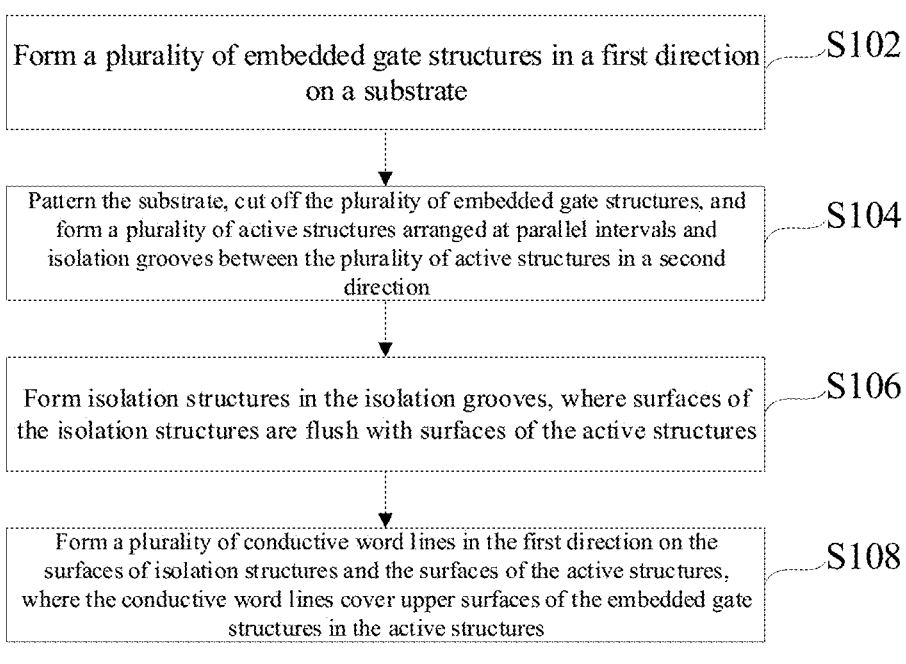
FIG. 1 is a flow diagram of a method for fabricating a memory device according to an embodiment.

201—substrate; 202—word line structure; 203—first trench; 301—embedded word line trench; 401—gate dielectric layer; 402—barrier layer; 403—tungsten conductive layer; 501—active area mask structure; 502—active structure; 503—buried gate structure; 601—strip-shaped mask; 602—strip-shaped structure; 701—island-shaped mask; 801—isolation structure; 901—conductive layer; 902—second nitride layer; 903—strip-shaped mask structure; 904—conductive word line; 905—second trench; and 100—isolation layer.

DETAILED DESCRIPTION

For ease of understanding the present disclosure, the present disclosure will be described more fully hereinafter with reference to the accompanying drawings. Some embodiments of the present disclosure are provided in the accompanying drawings. The present disclosure may, however, be embodied in many different forms and should not be limited to the embodiments set forth herein. Rather, these embodiments are provided such that the present disclosure will be more thorough and complete.

Unless otherwise defined, all technical and scientific terms employed herein have the same meaning as commonly understood by one of ordinary skill in the art to which the present disclosure belongs. The terms employed in the specification of the present disclosure are merely for the purpose of describing some embodiments and are not intended for limiting the present disclosure.

It should be understood that when an element or layer is referred to as being "on", "adjacent to", "connected to" or "coupled to" other elements or layers, it may be directly on, adjacent to, connected or coupled to the other elements or layers, or intervening elements or layers may be present. In contrast, when an element is referred to as being "directly on", "directly adjacent to", "directly connected to" or "directly coupled to" other elements or layers, there are no intervening elements or layers present. It should be understood that although the terms first, second, third, etc. may be employed to describe various elements, components, regions, layers, doping types and/or sections, these elements, components, regions, layers, doping types and/or sections should not be limited by these terms. These terms are only employed to distinguish one element, component, region, layer, doping type, or section from another element, component, region, layer, doping type, or section. Thus, without departing from the teachings of the present disclosure, a first element, component, region, layer, doping type or portion discussed below may be represented as a second element, component, region, layer or portion. For example, a first doping type may be a second doping type, and similarly, the second doping type may be the first doping type. Furthermore, the first doping type and the second doping type may be different doping types. For example, the first doping type may be a P type and the second doping type may be an N type, or the first doping type may be the N type and the second doping type may be the P type.

Spatially relative terms such as "below", "under", "lower", "beneath", "above", "upper" and the like may be used herein to describe relationships between one element or feature as shown in the figures and another element(s) or feature(s). It should be understood that the spatially relative terms may be intended to encompass different orientations of a device in use or operation in addition to the orientation depicted in the figures. For example, if the device in the figures is turned over, elements or features described as "under", "beneath" or "below" other elements would then be oriented "above" the other elements or features. Thus, the example term "under", "below" or "beneath" may encompass both an orientation of above and below. In addition, the device may also be otherwise oriented (for example, rotated 90 degrees or at other orientations) and the spatially relative descriptors used herein should be interpreted accordingly.

As used herein, the singular forms of "a", "one" and "said/the" are also intended to include plural forms, unless the context clearly indicates otherwise. It should also be understood that the terms "comprising" and/or "including", when used in this specification, may determine the presence of the described features, integers, steps, operations, elements and/or components, but do not preclude the presence or addition of one or more other features, integers, steps, operations, elements, components, and/or groups thereof. Meanwhile, as used herein, the term "and/or" includes any and all combinations of related listed items.

Embodiments of the present disclosure are described herein with reference to cross-sectional illustrations serving as schematic illustrations of idealized embodiments (and intermediate structures) of the present disclosure. As such, variations from the shapes of the illustrations as a result, for example, of manufacturing techniques and/or tolerances, may be expected. Thus, the embodiments of the present disclosure should not be construed as being limited to particular shapes of regions illustrated herein but may include deviations in shapes that result, for example, from the manufacturing techniques. For example, an injection region shown as a rectangle typically has circular or curved features and/or injection concentration gradients at its edges rather than a binary change from the injection region to a non-injection region. Likewise, a buried region formed by means of injection may result in some injections in a region between the buried region and a surface through which the injection proceeds. Thus, regions illustrated in the figures are schematic in nature and their shapes neither illustrate an actual shape of a region of the device nor limit the scope of the present disclosure.

In processes for fabricating a typical memory device, after the active areas and the isolation structures are formed first, the word line trenches are etched to fabricate the buried gate structures. The embedded gates penetrate through the active structures and the isolation structures. When a row of embedded gates in the memory matrix are activated or refreshed repeatedly, noise or interference may be produced to an adjacent row. Before adjacent cells are activated or refreshed, if an activation frequency of the adjacent row is too high, the adjacent cells may become fragile, and a problem of charge loss or electric leakage may occur, resulting in data errors of one or more cells in the adjacent row. This phenomenon is called hammer effects. When the hammer effects occur easily in the memory device, adverse effects may be caused to the performance of the memory device.

To solve the above problems, the present disclosure provides a method for fabricating a memory device. Referring to the flowchart of the method for fabricating the memory device as shown in FIG. 1, the method includes following steps.

Step S102: forming a plurality of buried gate structures in a first direction in a substrate.

A substrate is provided, and a plurality of buried gate structures in the first direction are formed on the substrate, where the buried gate structures are evenly spaced, and the buried gate structures are word line trenches filled with conductive materials.

The substrate may be undoped monocrystalline silicon, monocrystalline silicon doped with impurities, silicon-on-insulator (SOI), stacked silicon-on-insulator (SSOI), stacked silicon-germanium-on-insulator (S—SiGeOI), silicon-germanium-on-insulator (SiGeOI), and germanium-on-insulator (GeOI), etc. As an example, monocrystalline silicon may be selected as the substrate material in this embodiment.

Step S104: patterning the substrate, cutting off the plurality of buried gate structures, and forming the plurality of active structures arranged at parallel intervals and the isolation grooves between the plurality of active structures in the second direction.

The plurality of active structures are island-shaped columnar bodies, and the plurality of active structures comprise the plurality of buried gate structures. After the plurality of buried gate structures in the first direction are formed on the substrate, the substrate is patterned and etched, the plurality of buried gate structures of the substrate are cut off, to form the plurality of active structures arranged at parallel intervals, where the plurality of active structures are island-shaped columnar bodies, and the plurality of buried gate structures are embedded in the active structures. A height of each of the etched island-shaped columnar bodies is smaller than that of the substrate, and communication regions between the active structures form isolation grooves.

Step S106: forming isolation structures in the isolation grooves, where surfaces of the isolation structures are flush with surfaces of the plurality of active structures.

Isolation materials are filled in the isolation grooves between the active structures of island-shaped columnar bodies to form the isolation structures. The isolation structures surround peripheries of the active structures, and the isolation structures are as high as the island-shaped columnar bodies, such that the top surfaces of the isolation structures are flush with the top surfaces of the active structures. That is, the top surfaces of the isolation structures and the top surfaces of the active structures are in the same horizontal plane.

Step S108: forming a plurality of conductive word lines in a first direction on the surfaces of the isolation structures and the surfaces of the active structures, where the conductive word lines cover the upper surfaces of the buried gate structures in the active structures.

The directions of the conductive word lines are consistent with the directions of the word line trenches constituting the buried gate structures, and the bottom surfaces of the conductive word lines are in contact with the upper surfaces of the isolation structures and the upper surfaces of the active structures, and cover the top surfaces of the buried gate structures in each of the active structures, such that the buried gate structures in the same row are electrically connected in series.

According to the method for fabricating the memory device, first, buried gate structures in a first direction are formed on a substrate. Next, the substrate is patterned, the buried gate structures are cut off, and active structures arranged at parallel intervals and isolation grooves between the active structures are formed in a second direction, where the active structures are island-shaped columnar bodies, and the active structures include the buried gate structures. Next, isolation structures are formed in the isolation grooves, where surfaces of the isolation structures are flush with surfaces of the active structures. Last, conductive word lines in the first direction are formed on the surfaces of isolation structures and the surfaces of the active structures, where the conductive word lines cover upper surfaces of the buried gate structures in the active structures. Compared with first forming the active structures and the isolation structures on the substrate, and then forming the buried gate structures penetrating through the active structures and the isolation structures, in the memory device fabricated in the present disclosure, the buried gate structures are fabricated on the substrate first, and then the active structures and the isolation structures are formed to cut off the buried gate structures, such that the buried gate structures are present only in the active structures. The buried gate structures in the active structures are connected by means of the conductive word lines on the surfaces of the active structures and the surfaces of the isolation structures, and the buried gate structures do not penetrate through the active structures and the isolation structures, thereby avoiding causing adverse effects on adjacent buried gate structures when the conductive word lines energize the buried gate structures in the active structures in the same direction, weakening negative influences of hammer effects, and improving performance of the memory device.

Figure 2:
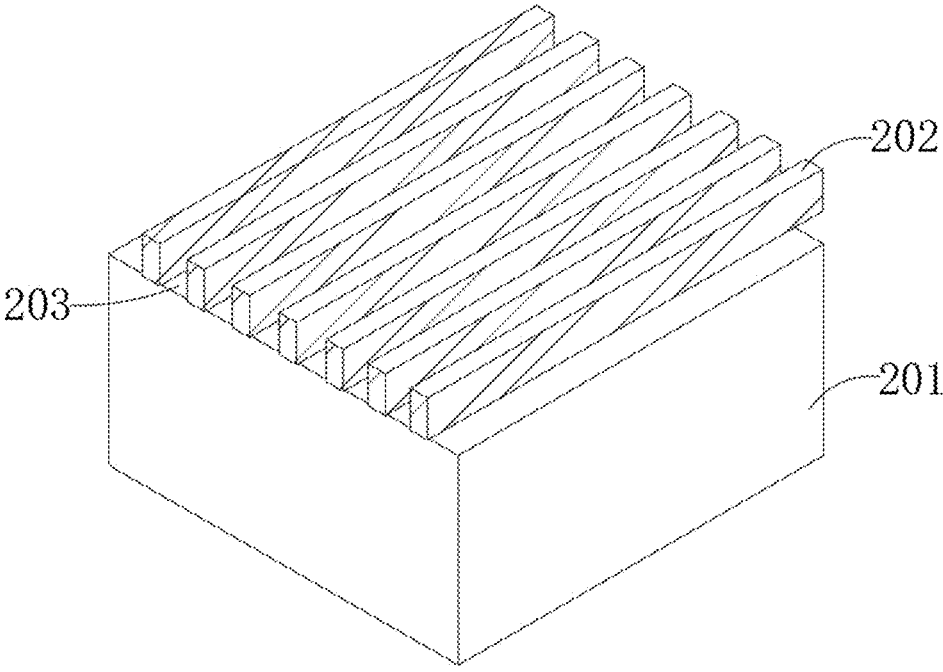
FIG. 2 is a schematic diagram of fabrication of an embedded word line trench according to an embodiment.
Figure 3:
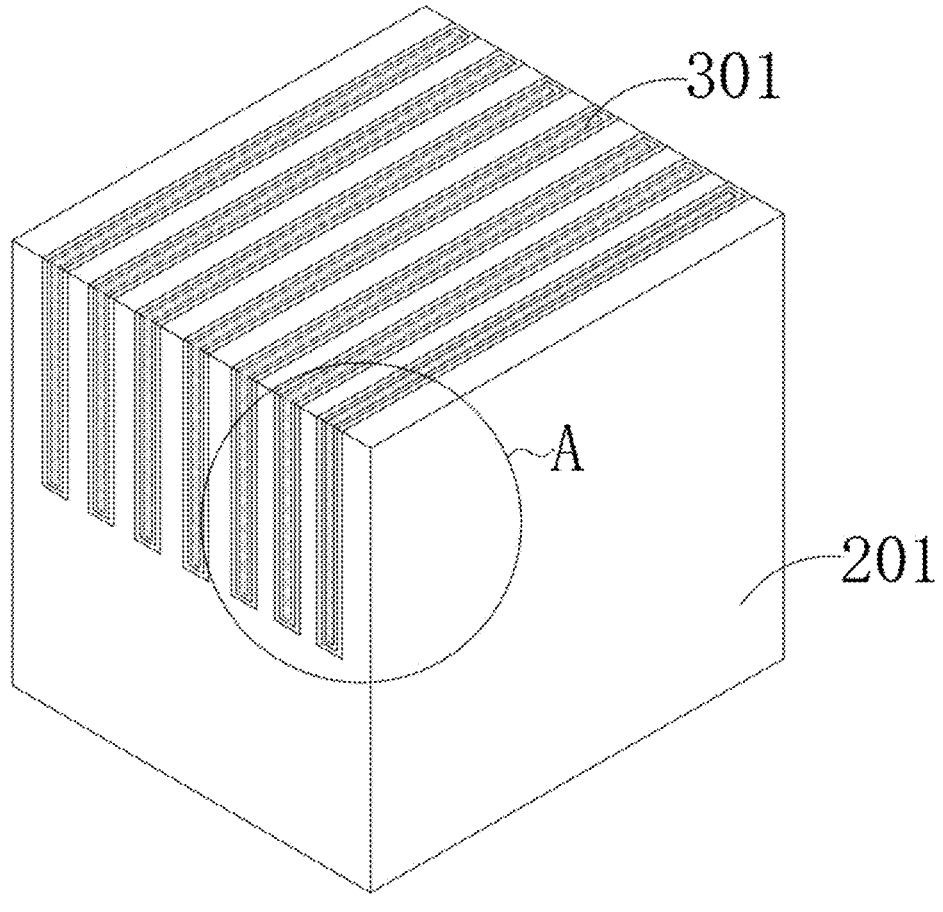
FIG. 3 is a front view of a memory device after an embedded word line trench is formed according to an embodiment.

As shown in FIG. 2 and FIG. 3, in one embodiment, Step S102 includes following steps.

Step S1022: forming a first mask layer on a surface of the substrate.

A photoresist layer is covered on the top surface of the substrate 201, and the photoresist layer is used as the first mask layer.

Step S1024: patterning the first mask layer to form a plurality of first trenches in the first direction exposing the surface of the substrate.

As shown in FIG. 2, the first mask layer is patterned and etched to obtain a plurality of word line structures 202 arranged at parallel intervals. Trenches between the adjacent word line structures that expose the surface of the substrate 201 are referred to as first trenches 203, and the first mask layer forms, on the substrate 201, a mask pattern covering a region to be retained. That is, the pattern formed by the first mask layer exposes positions of the word line trenches, on the substrate, that subsequently form the buried gate structures.

Step S1026: etching and removing part of the substrate below the plurality of first trenches using the first mask layer as an etching mask, to form a plurality of embedded word line trenches in the first direction.

The substrate not covered by the first mask layer is removed by etching, where an etching depth is less than the height of the substrate. In this way, the plurality of embedded word line trenches in the first direction formed on the substrate are obtained, and the word line structures formed by the first mask layer are removed.

Step S1028: filling a conductive material layer in each of the plurality of embedded word line trenches, such that an upper surface of the conductive material layer is flush with an upper surface of the substrate to form the plurality of buried gate structures.

As shown in FIG. 3, a conductive material layer, such as a TiN/W metal layer, is deposited in an embedded word line trench 301, and then the conductive material layer is planarized, such that the conductive material layer is flush with the surface of the substrate. Next, the plurality of buried gate structures in the first direction are formed on the substrate.

In one embodiment, before the above Step S1028, the method also includes: forming a gate dielectric layer on an inner wall (including a side wall and a bottom) of each of the plurality of embedded word line trenches, where the gate dielectric layer comprises a silicon oxide layer, and a barrier layer is deposited on a surface of the gate dielectric layer. First, the gate dielectric layer, also known as a gate oxide layer, is deposited in the embedded word line trench, and then the barrier layer and a conductive material layer are deposited in turn.

Figure 4:
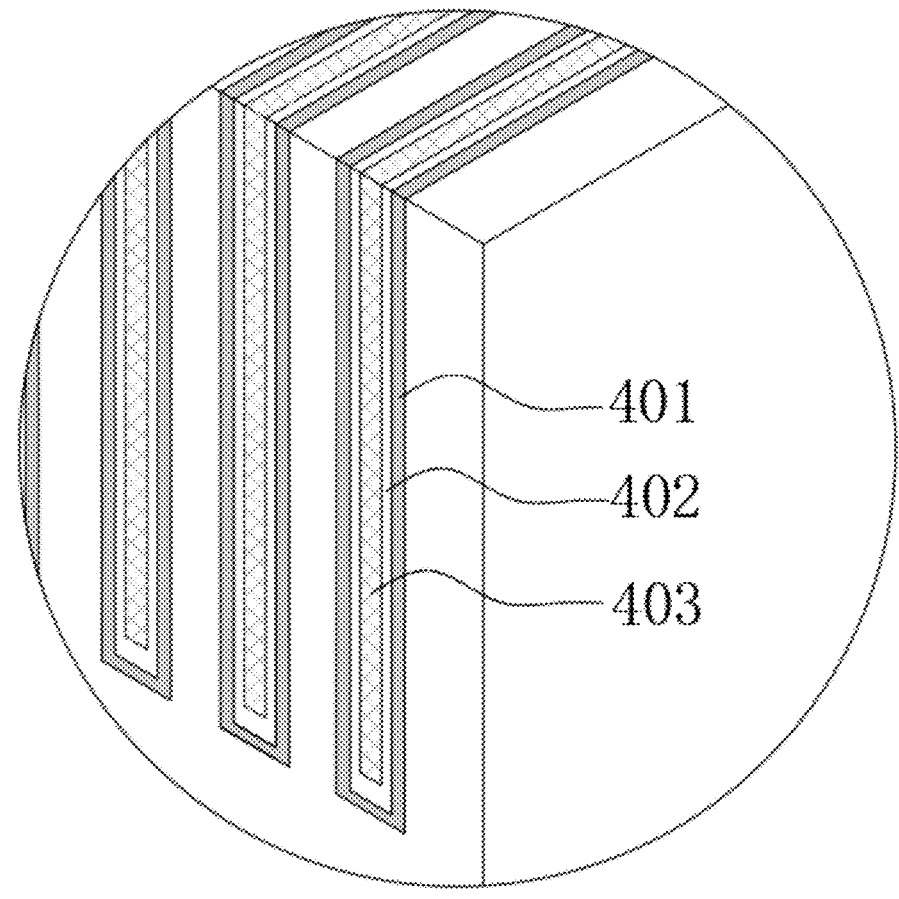
FIG. 4 is a partially enlarged view of A on a memory device after an buried gate structure is formed according to an embodiment.

In one embodiment, the gate dielectric layer includes a silicon nitride layer, the barrier layer includes a titanium nitride layer, the conductive material layer includes a tungsten conductive layer, and the isolation structure includes a silicon oxide structure. As shown in FIG. 4, which is a partially enlarged view of A in FIG. 3, silicon nitride side wall and bottom deposition is performed in the embedded word line trench based on an atomic layer deposition process, and a gate dielectric layer 401 (silicon oxide layer) is formed in the embedded word line trench. Titanium nitride is then deposited on the surface (including a side surface and a bottom surface) of the gate dielectric layer 401 based on an atomic layer deposition (ALD) process, such that a titanium nitride layer is covered on the gate dielectric layer to form the barrier layer 402, where the gate dielectric layer 401 surrounds the barrier layer 402. Next, a tungsten conductive layer 403 is deposited on the barrier layer 402, such that the barrier layer 402 surrounds a side wall and a bottom of the tungsten conductive layer 403, and the top surface of the gate dielectric layer 401, the top surface of the barrier layer 402 and the top surface of the tungsten conductive layer 403 are all flush with the top surface of the substrate.

In an embodiment, an atomic layer deposition reaction gas employed in the gate dielectric layer 401 may be a mixed reaction gas made up of $NH_3$ or $N_2/H_2$; and an atomic layer deposition reaction gas employed in the barrier layer 402 may be $LTO520/O^2$ or N zero/$O_2$.

Figure 5:
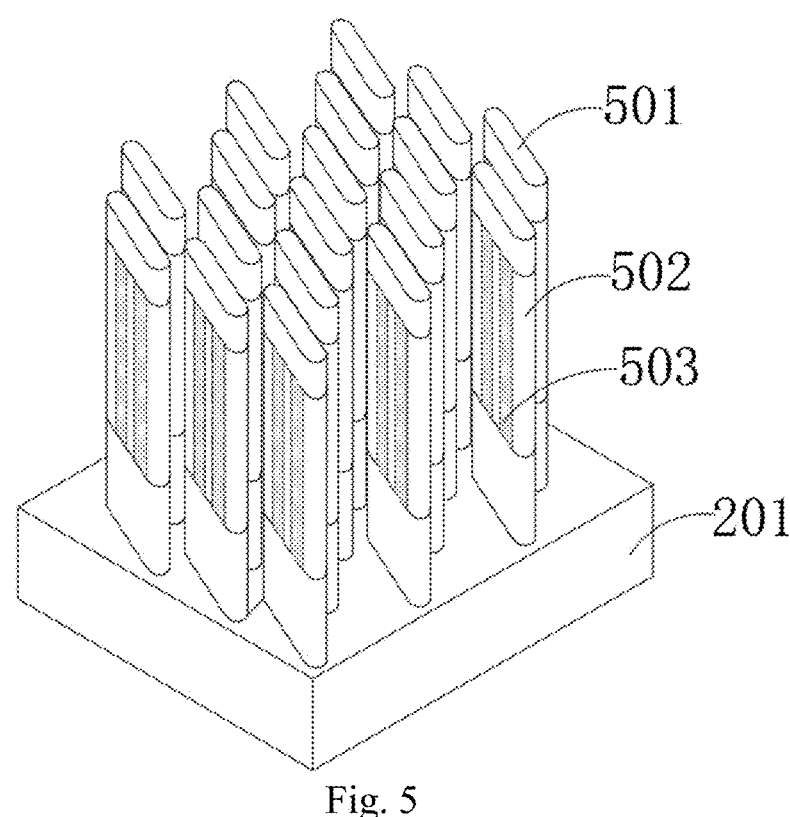
FIG. 5 is a front view of a memory device after an active structure is formed according to an embodiment.

As shown in FIG. 5, in one embodiment, the above Step S104 includes following steps.

Step S1042: forming a first nitride layer on the surface of the substrate, and patterning the first nitride layer, to form a plurality of active area mask structures arranged at parallel intervals in the second direction.

A nitride layer such as a silicon nitride layer is deposited on the surface of the substrate, and the first nitride layer is patterned and etched. As shown in FIG. 5, the first nitride layer forms active area mask structures 501 arranged at parallel intervals in a second direction, where the active area mask structures 501 in the second direction simultaneously cover two rows of buried gate structures (in the first direction).

Step S1044: etching and removing the substrate exposed using the plurality of active area mask structures as etching masks, to cut off the plurality of buried gate structures, and form the plurality of active structures arranged at parallel intervals and the isolation grooves between the plurality of active structures.

The active area mask structures 501 cover the substrate needing to be retained, and expose the substrate needing to be removed. As shown in FIG. 5, the substrate exposed by the active area mask structures 501 is removed by etching to obtain the active structures 502. The depth of each active structure 502 is greater than that of each buried gate structure 503, and the communication regions between the active structures 502 form the isolation grooves. Because the depth of each active structure 502 is greater than that of each buried gate structure 503, a path is formed outside the buried gate structure 503 to connect source/drain regions on the left and right of the buried gate structure 503.

In one embodiment, Step S1042 includes: forming a second mask layer on a top surface of the first nitride layer; patterning the second mask layer to form a strip-shaped mask in the second direction, and etching and removing the first nitride layer exposed using the second mask layer as an etching mask, such that the first nitride layer forms a strip-shaped structure in the second direction; and cutting off the strip-shaped mask in the second direction into an island-shaped mask having a preset length, and etching and removing the first nitride layer exposed using the island-shaped mask as an etching mask, such that the first nitride layer forms the plurality of active area mask structures arranged at parallel intervals. For example, the first nitride layer may be a silicon nitride layer.

Figure 6:
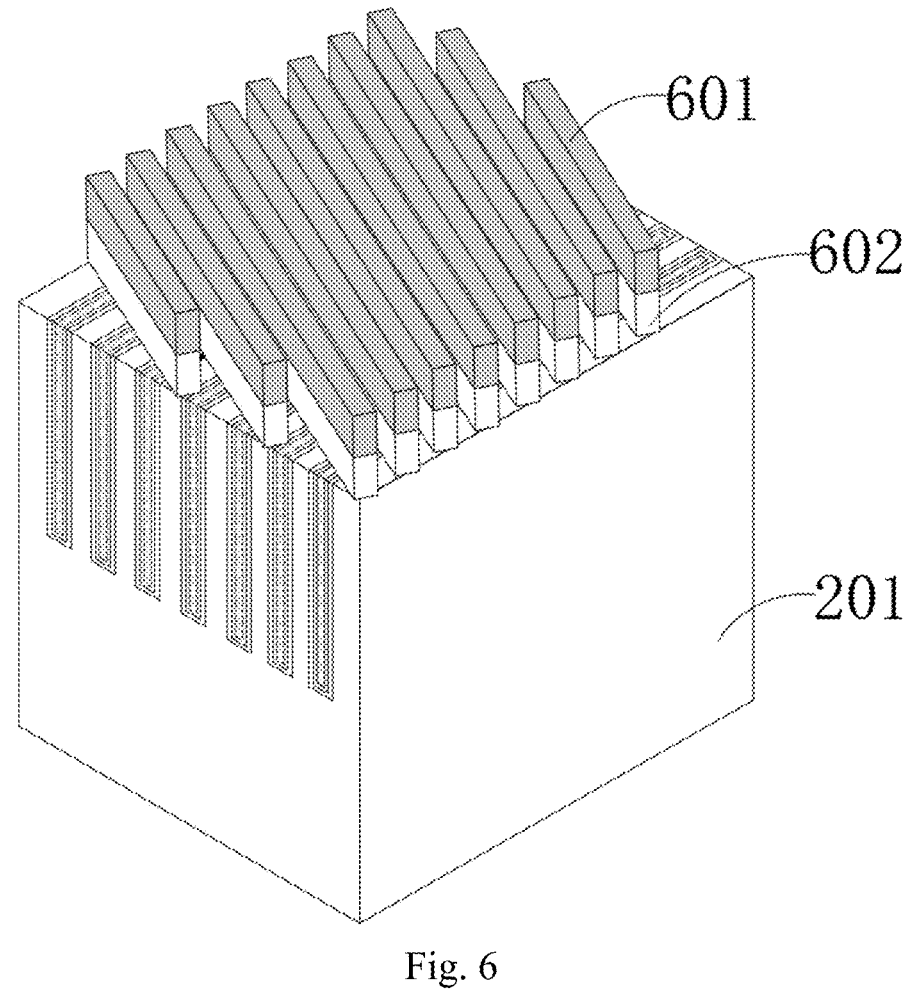
FIG. 6 is a front view of a memory device after a strip-shaped mask is formed on a substrate according to an embodiment.

A second mask layer is deposited above the first nitride layer. As shown in FIG. 6, the second mask layer is patterned and etched to form the strip-shaped mask 601 in the second direction. The strip-shaped mask 601 exposes the first nitride layer needing to be removed. The first nitride layer exposed is removed by etching by using the strip-shaped mask 601 formed by the second mask layer as an etching mask. The first nitride layer forms a strip-shaped structure 602 in the second direction.

Figure 7A:
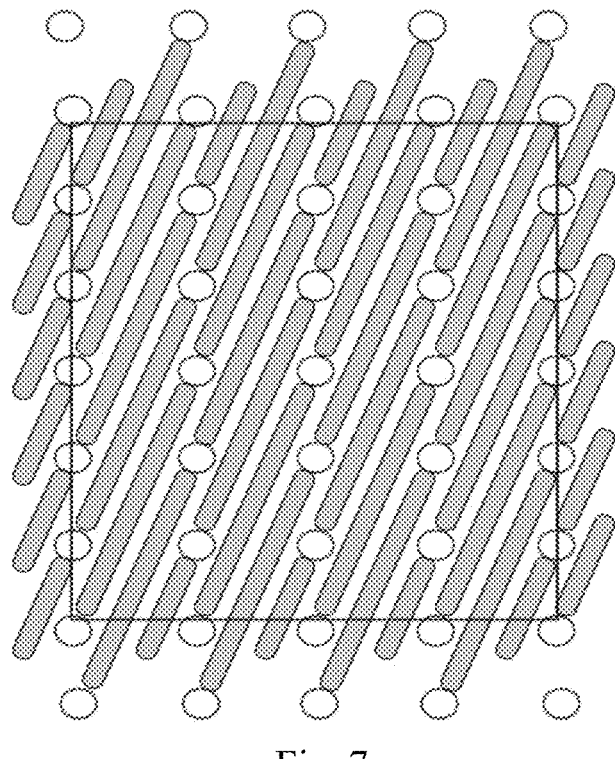
FIG. 7a is a top view of a memory device after a strip-shaped mask is patterned and etched for a first time according to an embodiment.
Figure 7B:
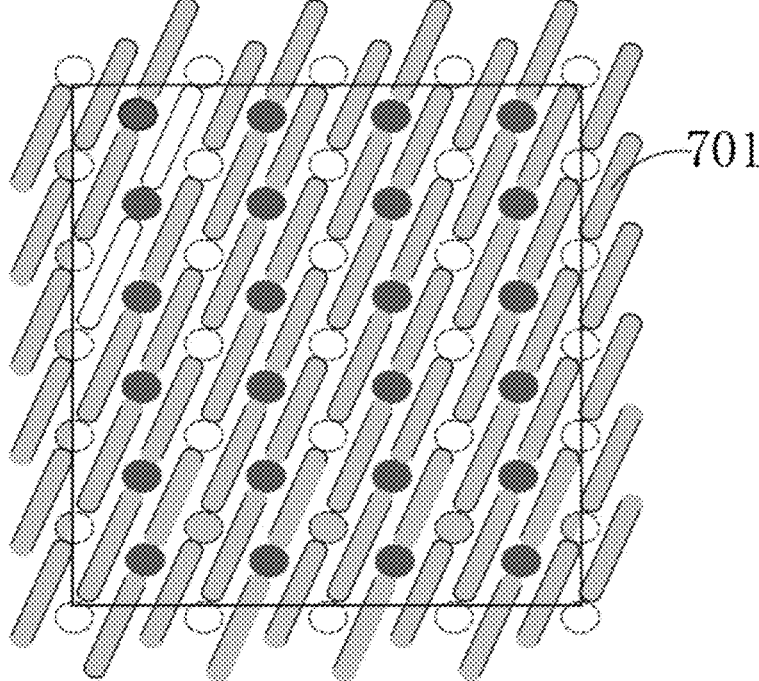
FIG. 7b is a top view of a memory device after a strip-shaped mask is patterned and etched for a second time according to an embodiment.
Figure 7C:
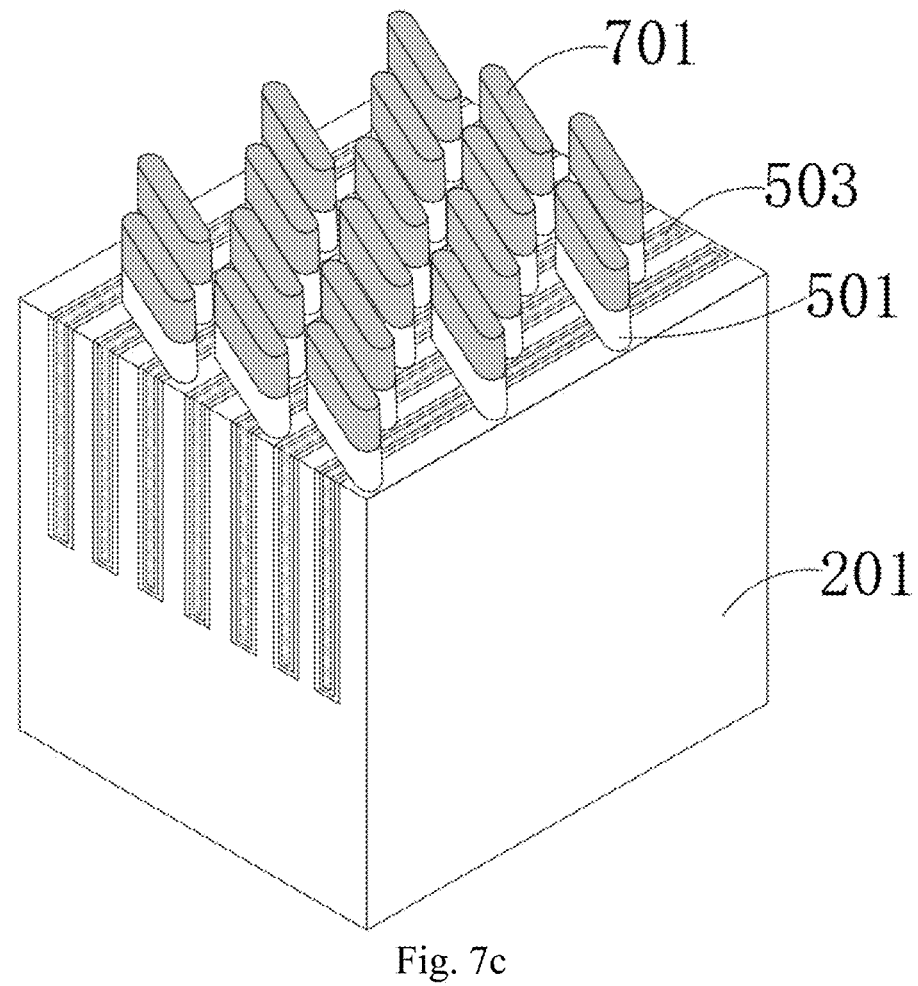
FIG. 7c is a front view of a memory device after an island-shaped mask is formed according to an embodiment.

As shown in FIG. 7a to FIG. 7c, the strip-shaped mask 601 is patterned and etched. The strip-shaped mask 601 is patterned and etched for two times to cut off a plurality of island-shaped masks 701 arranged at parallel intervals, and the first nitride layer exposed is removed by etched by using each island-shaped mask 701 as an etching mask, such that the strip-shaped structure 602 formed by the first nitride layer forms the plurality of active area mask structures 501 arranged at parallel intervals. As shown in the figure, each active area mask structure 501 in the second direction covers two rows of buried gate structures 503 (in the first direction).

Figure 8:
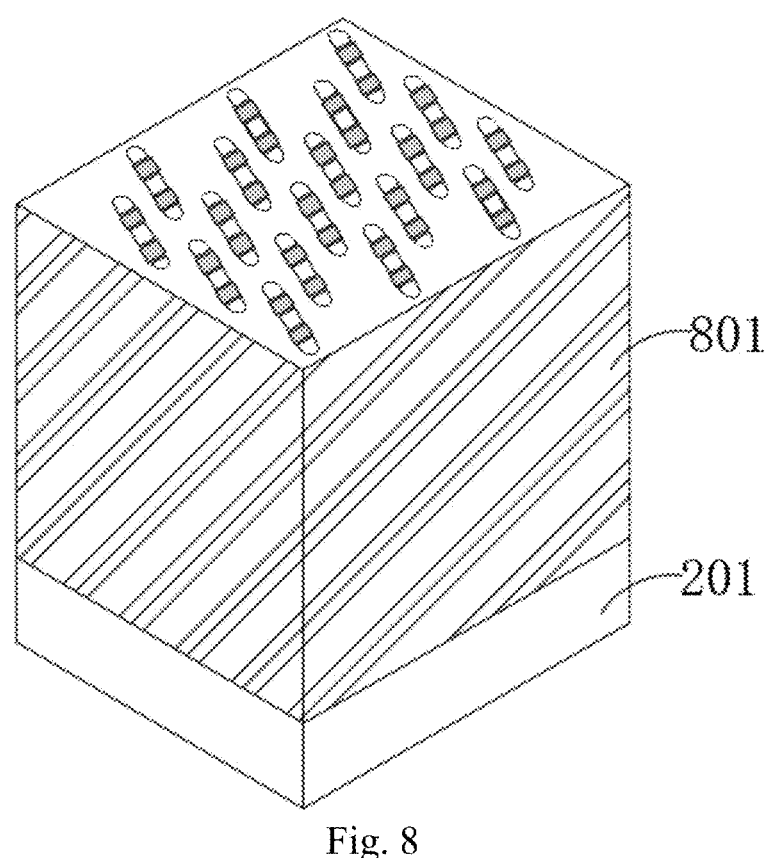
FIG. 8 is a front view of a memory device after an isolation structure is formed according to an embodiment.

As shown in FIG. 8, in one embodiment, the above Step S106 includes following steps.

Step S1062: performing a chemical vapor deposition process to form the isolation structures in the isolation grooves.

An isolation groove is formed in the communication region between the active structures 502 in FIG. 5, and a silicon oxide material is filled into the isolation groove as an isolation material by means of a chemical vapor deposition process, the active area mask structure 501 on the top surface of the active structure 502 is removed, and the isolation material forms isolation structures 801 in the isolation groove.

Step S1064: planarizing top surfaces of the isolation structures 801 and top surfaces of the plurality of active structures 502, such that the top surfaces of the isolation structures 801 are flush with the top surfaces of the plurality of active structures 502.

The top surfaces of the isolation structures 801 are planarized by means of a chemical polishing process, such that the top surfaces of the isolation structures 801 and the top surfaces of the active structures 502 are in the same horizontal plane.

In one embodiment, the above Step S108 includes following steps.

Step S1082: forming conductive layers on the top surfaces of the isolation structures 801 and the top surfaces of the plurality of active structures 502.

Figure 9A:
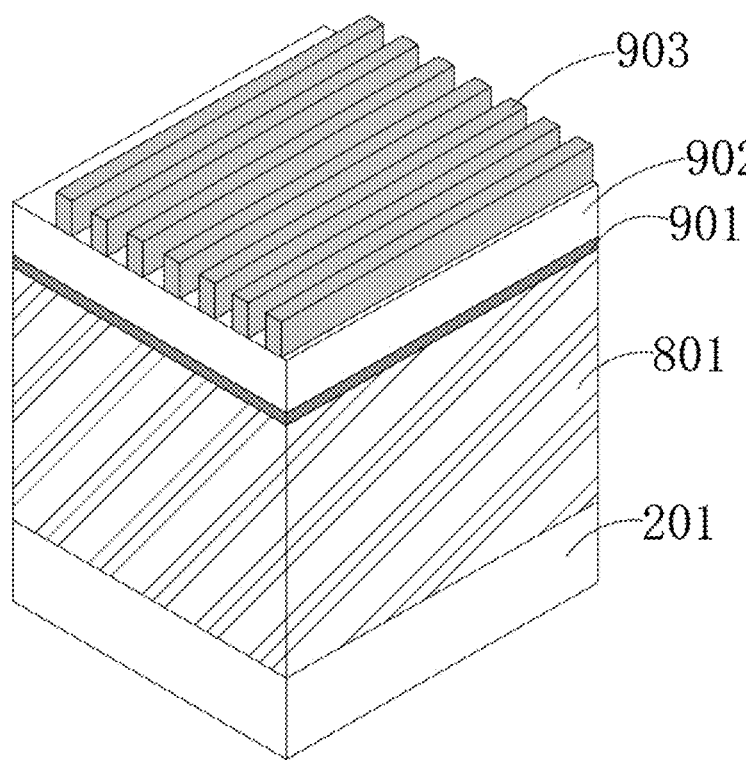
FIG. 9a is a front view of a memory device after a substrate is covered with a conductive layer and a second nitride layer according to an embodiment.

As shown in FIG. 9a, conductive layers 901 are deposited on the top surfaces of the isolation structures 801 and the top surfaces of the active structures 502, where the conductive layers may be tungsten metal layers.

Step S1084: patterning the conductive layers to form the plurality of conductive word lines in the first direction and second trenches between the plurality of conductive word lines.

In one embodiment, a second nitride layer 902 (a silicon nitride layer) is formed on the top surface of the conductive layer 901; and the second nitride layer 902 is patterned to expose a part of the conductive layer 901. A top surface of the second nitride layer 902 is covered with a photoresist layer, and the photoresist layer above the second nitride layer 902 is patterned and etched to obtain a strip-shaped mask structure 903. As shown in FIG. 9a, the second nitride layer 902 is patterned and etched using the strip-shaped mask structure 903 as an etching mask, such that the second nitride layer 902 exposes a part of the conductive layer. The photoresist layer may be a photosensitive anti-corrosion coating material made up of a photosensitive resin, a sensitizer, and a solvent, etc.

Figure 9B:
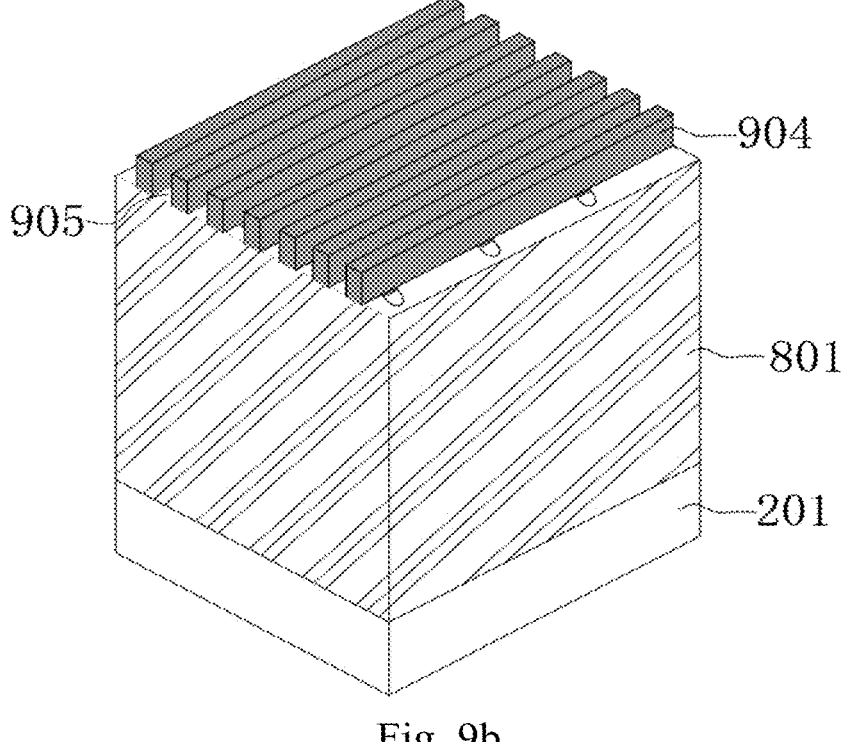
FIG. 9b is a front view of a memory device after a conductive word line is formed according to an embodiment.

The strip-shaped mask structure 903 is removed, and the conductive layer exposed is removed by etching by using the second nitride layer 902 as an etching mask. As shown in FIG. 9b, a plurality of conductive word lines 904 in the first direction and second trenches 905 between the conductive word lines are formed. The strip-shaped mask structure 903 and the word line structure 202 in FIG. 2 have the same relative position and direction with respect to the substrate, such that the conductive word lines formed cover exactly middle positions of the word line trenches.

Figures 9C, 10:
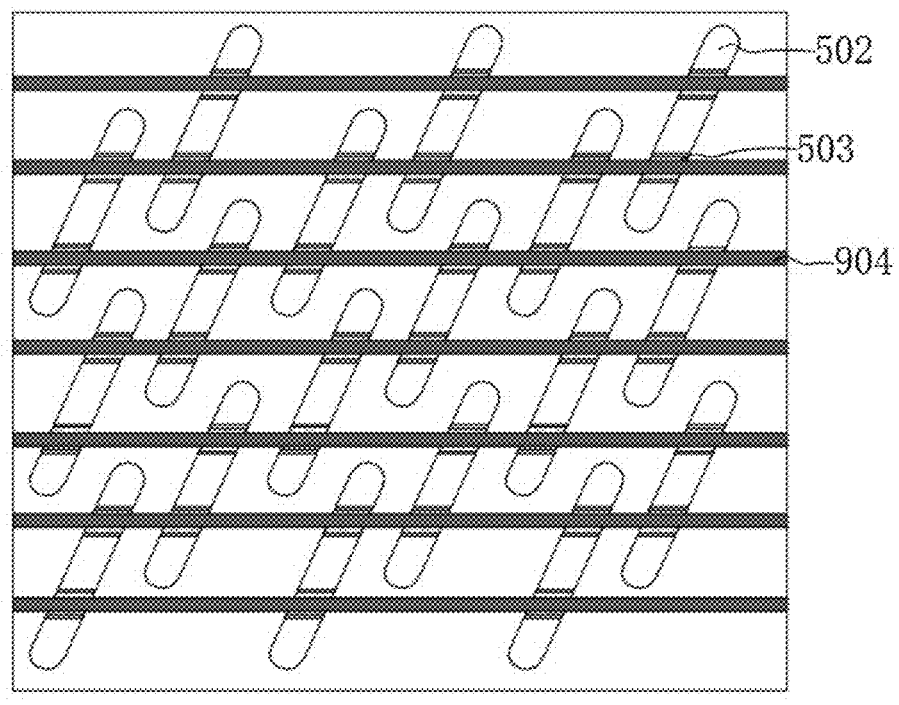
FIG. 9c is a top view of a memory device after a conductive word line is formed according to an embodiment.
FIG. 10 is a front view of a memory device after an isolation layer is formed according to an embodiment.

As shown in FIG. 9c, which is a top view of FIG. 9b, the width of each conductive word line 904 is less than that of each buried gate structure 503 in the active structures, and the conductive word lines 904 are employed to electrically connect the underlying buried gate structures 503 in the same row. By covering the conductive word lines 904 above the buried gate structures in the active structures, it is avoidable causing noise or interference to the embedded gates in the adjacent row when one row of embedded gates are activated or refreshed repeatedly, and the hammer effects are reduced.

As shown in FIG. 10, in one embodiment, the method for fabricating the memory device further includes: forming an isolation layer 100 that fills the second trench 905 and covers the conductive word line 904. The isolation layer 100 is deposited on the top surface of the conductive word line 904 based on a low-pressure chemical vapor deposition method. In an embodiment, the isolation layer 100 may be a silicon nitride layer, and a reaction gas for the low-pressure chemical vapor deposition may be $SiH_4$ or $SiH_2Cl_2$.

In an embodiment, the etching process may employ dry etching, and an etching gas may employ $SF_6$, $CF_4$, $Cl_2$, $CHF_3$, $O_2$, Ar, or a mixed gas.

The present disclosure also provides a memory device, which is fabricated by means of the method in any one of the above embodiments. As shown in FIGS. 9b to 9c, the memory device includes a substrate 201, a plurality of buried gate structures 503 formed on the substrate 201, an isolation structure 801, a plurality of active structures 502 arranged at parallel intervals in the second direction, and a plurality of conductive word lines 904 in the first direction.

The plurality of active structures 502 are island-shaped columnar bodies, the isolation structures 801 are embedded in isolation grooves between the plurality of active structures 502, and surfaces of the plurality of active structures 502 are flush with surfaces of the isolation structures 801.

The plurality of buried gate structures 503 are embedded in the plurality of active structures 502, and surfaces of the plurality of buried gate structures 503 are flush with the surfaces of the plurality of active structures 502.

The plurality of conductive word lines 904 are in contact with top surfaces of the plurality of embedded word line structures 503 and top surfaces of the isolation structures 801, and the plurality of buried gate structures 503 arranged along the first direction are electrically connected on the top surfaces of the isolation structures 801.

In one embodiment, each of the plurality of buried gate structures includes an embedded word line trench and a conductive material layer, where the conductive material layer fills the embedded word line trench, as shown in FIG. 9c, and a width of the embedded word line trench is greater than or equal to a width of each of the plurality of conductive word lines.

In one embodiment, as shown in FIG. 4, the memory device includes a gate dielectric layer 401 and a barrier layer 402, where the gate dielectric layer 401 is formed on an inner wall and a bottom of the embedded word line trench, and the barrier layer 402 is formed on a surface of the gate dielectric layer 401, such that the gate dielectric layer 401 surrounds the barrier layer 402. In an embodiment, the gate dielectric layer 401 may be a silicon oxide layer, and the barrier layer 402 may be a titanium nitride layer.

In an embodiment, the bottoms of the plurality of buried gate structures are flush with each other. Because the embedded word line trenches are etched on the substrate first, the bottoms of the buried gate structures are positioned on the same horizontal plane. That is, depths of the word line trenches forming the buried gate structures are equal in the substrate (in the prior art, the active structures and the isolation structures are first formed on the substrate, and then the word line trenches are etched, which easily leads to uneven word line trenches etched due to difference in etching rate, thus causing the bottoms of the buried gate structures to be uneven in height).

In an embodiment, the memory device further includes an isolation layer 100, which is formed on the conductive word lines 904 and is filled in the second trench 905 between conductive word lines 904.

The present disclosure also provides a memory apparatus, which includes the memory device.

It is to be understood that although the steps in the flowchart of FIG. 1 are sequentially displayed as indicated by the arrows, these steps are not necessarily sequentially performed in the order indicated by the arrows. Unless expressly stated herein, the execution of these steps is not strictly restrictive and may be performed in other order. Moreover, at least a part of the steps in FIG. 1 may include a plurality of steps or a plurality of stages, which are not necessarily performed at the same moment, but may be executed at different moments, and the order of execution of these steps or stages is not necessarily performed sequentially, but may be performed alternately or alternately with at least a part of the steps or stages of other steps or other steps.

The technical features of the above embodiments may be arbitrarily combined. For simplicity, all possible combinations of the technical features in the above embodiments are not described. However, as long as the combination of these technical features is not contradictory, it shall be deemed to be within the scope recorded in this specification.

The above embodiments merely express a plurality of implementations of the present disclosure, and descriptions thereof are relatively concrete and detailed. However, these embodiments are not thus construed as limiting the patent scope of the present disclosure. It is to be pointed out that for persons of ordinary skill in the art, some modifications and improvements may be made under the premise of not departing from a conception of the present disclosure, which shall be regarded as falling within the scope of protection of the present disclosure. Thus, the scope of protection of the present disclosure shall be subject to the appended claims.

What is claimed is:

1. A method for fabricating a memory device, comprising:
   forming a plurality of buried gate structures in a first direction in a substrate;
   forming a first nitride layer on the surface of the substrate, and patterning the first nitride layer, to form a plurality of active area mask structures arranged at parallel intervals in the second direction;
   etching and removing the substrate exposed using the plurality of active area mask structures as etching masks, to cut off the plurality of buried gate structures, and form a plurality of active structures arranged at parallel intervals and isolation grooves between the plurality of active structures, wherein a depth of each of the plurality of active structures is greater than a depth of each of the plurality of buried gate structures; wherein the plurality of active structures are island-shaped columnar bodies, and the plurality of active structures comprise a plurality of remained buried gate structures;

forming isolation structures in the isolation grooves, surfaces of the isolation structures being flush with surfaces of the plurality of active structures; and forming a plurality of conductive word lines in the first direction on the top surfaces of isolation structures and the top surfaces of the plurality of active structures, the plurality of conductive word lines covering upper surfaces of the plurality of buried gate structures in the plurality of active structures.

2. The method for fabricating the memory device according to claim 1, wherein the patterning the first nitride layer comprises:

forming a second mask layer on a top surface of the first nitride layer;

patterning the second mask layer to form a strip-shaped mask in the second direction, and etching and removing the first nitride layer exposed using the second mask layer as an etching mask, such that the first nitride layer forms a strip-shaped structure in the second direction; and cutting off the strip-shaped mask in the second direction into an island-shaped mask having a preset length, and etching and removing the first nitride layer exposed using the island-shaped mask as an etching mask, such that the first nitride layer forms the plurality of active area mask structures arranged at parallel intervals.

3. The method for fabricating the memory device according to claim 1, wherein the forming the isolation structures in the isolation grooves comprises:

performing a chemical vapor deposition process to form the isolation structures in the isolation grooves; and planarizing top surfaces of the isolation structures and top surfaces of the plurality of active structures, such that the top surfaces of the isolation structures are flush with the top surfaces of the plurality of active structures.

4. The method for fabricating the memory device according to claim 1, wherein the forming the plurality of buried gate structures in the first direction in the substrate comprises:

forming a first mask layer on a surface of the substrate;

patterning the first mask layer to form a plurality of first trenches in the first direction exposing the surface of the substrate;

etching and removing part of the substrate below the plurality of first trenches using the first mask layer as an etching mask, to form a plurality of embedded word line trenches in the first direction; and filling a conductive material layer in each of the plurality of embedded word line trenches, such that an upper surface of the conductive material layer is flush with an upper surface of the substrate to form the plurality of buried gate structures.

5. The method for fabricating the memory device according to claim 4, wherein before filling the conductive material layers in the plurality of embedded word line trenches, the method further comprises: forming a gate dielectric layer on an inner wall of each of the plurality of embedded word line trenches.

6. The method for fabricating the memory device according to claim 5, wherein the gate dielectric layer comprises a silicon oxide layer, each of the conductive material layers comprises a tungsten conductive layer, and each of the isolation structures comprises a silicon oxide structure.

7. The method for fabricating the memory device according to claim 1, wherein the forming the plurality of conductive word lines in the first direction on the surfaces of the isolation structures and the surfaces of the plurality of active structures comprises:

forming conductive layers on the top surfaces of the isolation structures and the top surfaces of the plurality of active structures; and patterning the conductive layers to form the plurality of conductive word lines in the first direction and second trenches between the plurality of conductive word lines.

8. The method for fabricating the memory device according to claim 7, wherein the patterning the conductive layers to form the plurality of conductive word lines in the first direction and the second trenches between the plurality of conductive word lines comprises:

forming a second nitride layer on a top surface of each of the conductive layers;

patterning the second nitride layer to expose part of the conductive layers; and etching and removing the conductive layers exposed using the second nitride layer as an etching mask, to form the plurality of conductive word lines in the first direction and the second trenches between the plurality of conductive word lines.

9. The method for fabricating the memory device according to claim 7, further comprising:

forming isolation layers, the isolation layers filling the second trenches and covering the plurality of conductive word lines.

10. A memory device, comprising: a substrate, a plurality of buried gate structures formed on the substrate, isolation structures, a plurality of conductive word lines in a first direction, and a plurality of active structures arranged at parallel intervals in a second direction;

wherein the plurality of active structures are island-shaped columnar bodies, the isolation structures are embedded in isolation grooves between the plurality of active structures, and surfaces of the plurality of active structures are flush with surfaces of the isolation structures;

wherein the plurality of buried gate structures are embedded in the plurality of active structures, and surfaces of the plurality of buried gate structures are flush with the surfaces of the plurality of active structures, and the plurality of buried gate structures are arranged at intervals in the first direction; and wherein the plurality of conductive word lines are in contact with top surfaces of the plurality of buried gate structures and top surfaces of the isolation structures, and the plurality of buried gate structures arranged along the first direction are electrically connected through a corresponding one of the conductive word lines.

11. The memory device according to claim 10, wherein bottoms of the plurality of buried gate structures are flush with each other.

12. The memory device according to claim 10, further comprising an isolation layer, wherein the isolation layer is formed on each of the plurality of conductive word lines and is filled between the plurality of conductive word lines.

13. The memory device according to claim 10, wherein each of the plurality of buried gate structures comprises an embedded word line trench and a conductive material layer, the conductive material layer filling the embedded word line trench, and a width of the embedded word line trench being greater than or equal to a width of each of the plurality of conductive word lines.

14. The memory device according to claim 13, further comprising a gate dielectric layer and a barrier layer, wherein the gate dielectric layer is formed on an inner wall of the embedded word line trench, and the barrier layer is formed on a surface of the gate dielectric layer.

15. The memory device according to claim 10, wherein the plurality of buried gate structures are present only in the active structures and are not located in the isolation structures.

16. The memory device according to claim 15, wherein each active structure is embedded with two corresponding buried gate structures of the plurality of buried gate structures.

17. A method for fabricating a memory device, comprising:

forming a first mask layer on a surface of the substrate;

patterning the first mask layer to form a plurality of first trenches in the first direction exposing the surface of the substrate;

etching and removing part of the substrate below the plurality of first trenches using the first mask layer as an etching mask, to form a plurality of embedded word line trenches in the first direction; and filling a conductive material layer in each of the plurality of embedded word line trenches, such that an upper surface of the conductive material layer is flush with an upper surface of the substrate to form a plurality of buried gate structures;

patterning the substrate, cutting off the plurality of buried gate structures, and forming a plurality of active structures arranged at parallel intervals and isolation grooves between the plurality of active structures in a second direction, wherein the plurality of active structures are island-shaped columnar bodies, and the plurality of active structures comprise the plurality of remained buried gate structures;

forming isolation structures in the isolation grooves, surfaces of the isolation structures being flush with surfaces of the plurality of active structures; and forming a plurality of conductive word lines in the first direction on the top surfaces of isolation structures and the top surfaces of the plurality of active structures, the plurality of conductive word lines covering upper surfaces of the plurality of buried gate structures in the plurality of active structures.

18. The method for fabricating the memory device according to claim 17, wherein the patterning the first nitride layer comprises:

forming a second mask layer on a top surface of the first nitride layer;

patterning the second mask layer to form a strip-shaped mask in the second direction, and etching and removing the first nitride layer exposed using the second mask layer as an etching mask, such that the first nitride layer forms a strip-shaped structure in the second direction; and cutting off the strip-shaped mask in the second direction into an island-shaped mask having a preset length, and etching and removing the first nitride layer exposed using the island-shaped mask as an etching mask, such that the first nitride layer forms the plurality of active area mask structures arranged at parallel intervals.

* * * * *